(12) United States Patent
Lee et al.

(10) Patent No.: US 6,897,908 B2
(45) Date of Patent: May 24, 2005

(54) LIQUID CRYSTAL DISPLAY PANEL HAVING REDUCED FLICKER

(75) Inventors: Hsin-Ta Lee, Tainan (TW);
Yuan-Liang Wu, Tainan (TW);
Cheng-I Wu, Tainan (TW); Wen-Chieh Lin, Tainan (TW)

(73) Assignee: Chi Mei Optoelectronics Corporation, Tainan (TW)

( * ) Notice: Subject to any disclaimer, the term of this patent is extended or adjusted under 35 U.S.C. 154(b) by 0 days.

(21) Appl. No.: 10/064,777

(22) Filed: Aug. 16, 2002

(65) Prior Publication Data

US 2003/0098934 A1 May 29, 2003

Related U.S. Application Data

(63) Continuation-in-part of application No. 10/064,049, filed on Jun. 4, 2002.

(30) Foreign Application Priority Data

Nov. 23, 2001 (TW) ........................................ 90129131 A

(51) Int. Cl.$^7$ .............................................. G02F 1/136
(52) U.S. Cl. .............................. 349/43; 345/87; 345/92
(58) Field of Search ........................... 349/42–43, 38–39, 349/48, 139; 345/87, 92; 257/72, 59

(56) References Cited

U.S. PATENT DOCUMENTS

| | | | | |
|---|---|---|---|---|
| 5,235,448 A | * | 8/1993 | Suzuki et al. ................... 349/43 |
| 5,369,512 A | * | 11/1994 | Yanai et al. ..................... 349/38 |
| 5,459,596 A | * | 10/1995 | Ueda et al. ..................... 349/39 |
| 5,546,205 A | * | 8/1996 | Sukegawa et al. ............. 349/46 |
| 5,629,783 A | * | 5/1997 | Kanbara et al. ................ 349/70 |
| 5,668,650 A | * | 9/1997 | Mori et al. ..................... 349/42 |
| 5,745,194 A | * | 4/1998 | Nakashima et al. ........... 349/38 |
| 5,886,365 A | * | 3/1999 | Kouchi et al. ................. 257/59 |
| 5,978,059 A | * | 11/1999 | Ohta et al. ..................... 349/141 |
| 6,020,214 A | | 2/2000 | Watanabe et al. |
| 6,028,650 A | * | 2/2000 | Kuroha et al. ................. 349/38 |
| 6,046,790 A | * | 4/2000 | Hara et al. ..................... 349/172 |
| 6,115,018 A | * | 9/2000 | Okumura et al. .............. 345/95 |
| 6,226,057 B1 | | 5/2001 | Lee |
| 6,249,325 B1 | | 6/2001 | Ohkawara et al. |
| 6,310,668 B1 | | 10/2001 | Ukita |
| 6,504,585 B2 | | 1/2003 | Ohkawara et al. |
| 6,507,375 B1 | | 1/2003 | Kawahata |
| 6,707,441 B1 | | 3/2004 | Hebiguchi et al. |
| 6,738,650 B1 | * | 5/2004 | Zhou et al. .................... 455/575.5 |
| 6,760,081 B2 | * | 7/2004 | Takagi ............................ 349/38 |
| 2002/0080317 A1 | * | 6/2002 | Yeo et al. ...................... 349/149 |

FOREIGN PATENT DOCUMENTS

| | | | | |
|---|---|---|---|---|
| CN | 1287287 A | | 3/2001 | |
| JP | 04225329 | * | 8/1992 | ................. 349/51 |
| TW | 495635 | | 7/2002 | |

* cited by examiner

*Primary Examiner*—Karl D. Frech
*Assistant Examiner*—Edwyn Labaze
(74) *Attorney, Agent, or Firm*—Winston Hsu

(57) ABSTRACT

A liquid crystal display panel includes an upper substrate, a lower substrate, and a plurality of pixels located between the upper substrate and the lower substrate. Each of the pixels has at least a compensating capacitor for providing an approximately identical feed-through voltage for each of the pixels, thus reducing a flicker effect of the liquid crystal display device.

40 Claims, 9 Drawing Sheets

LIQUID CRYSTAL DISPLAY PANEL HAVING REDUCED FLICKER

CROSS REFERENCE TO RELATED APPLICATIONS

This is a continuation-in-part of U.S. application Ser. No. 10/064,049, filed Jun. 4, 2002, and which is included herein by reference.

BACKGROUND OF THE INVENTION

1. Field of the Invention

The present invention relates to a liquid crystal display (LCD) panel, and more particularly, to a liquid crystal display panel with low flicker.

2. Description of the Prior Art

A thin film transistor display, such as a thin film transistor liquid crystal display (TFT-LCD), utilizes many thin film transistors, in conjunction with other elements such as capacitors and bonding pads, arranged in a matrix as switches for driving liquid crystal molecules to produce brilliant images. The advantages of the TFT-LCD over a conventional CRT monitor include better portability, lower power consumption, and lower radiation. Therefore, the TFT-LCD is widely used in various portable products, such as notebooks, personal data assistants (PDA), electronic toys, etc.

Please refer to FIG. 1 and FIG. 2. FIG. 1 is a schematic diagram of a prior art TFT-LCD. FIG. 2 is an equivalent circuit diagram of the TFT-LCD. The TFT-LCD 10 comprises a lower substrate 12. The lower substrate 12 comprises a pixel array 14, a scanning line driving circuit 16, and a data line driving circuit 18. The pixel array 14 includes a plurality of scanning lines (not shown) and a plurality of data lines (not shown). A plurality of pixels (ex. pixels A, B, C, B', and C') is therefore defined by the scanning lines and the data lines. The pixel A, B, and C are located on the same scanning line, while the pixel A, B' and C' are located on the same data line.

As shown in FIG. 1, the scanning line driving circuit 16 comprises a plurality of driver IC chips (such as chips 16a, 16b, and 16c), which are directly formed on the lower substrate 12 by utilizing chip-on-glass (COG) technology. Additionally, the driver IC chips are connected to each other by several bus lines 17, which is the so-called wiring on array (WOA) technology.

As shown in FIG. 2, a pixel 20 comprises a liquid crystal cell (LC) and a thin film transistor (TFT). The liquid crystal cell (LC) is made of a pixel electrode, a common counter electrode (CE), and a liquid crystal layer inserted there between. The thin film transistor (TFT) comprises a gate electrode connected to a scanning line $GL_0$, a drain electrode connected to a data line $DL_0$, and a source electrode connected to a pixel electrode of the liquid crystal cell. A parasitic capacitor (GS) is produced since the gate electrode and the source electrode of the thin film transistor (TFT) forms an overlapping region. Additionally, the pixel 20 contains a storage capacitor (SC) connected between the liquid crystal cell and a scanning line $GL_1$. The storage capacitor is used to reduce the voltage variation of the liquid crystal cell due to current leakage and thus help the liquid crystal cell store electric charges.

As shown in FIG. 2, the light passing through the pixels varies with the voltage applied to the liquid crystal cell. By changing the voltage to the liquid crystal cell, the amount of light passing through each pixel can be changed and thus the TFT-LCD can display predetermined images. The voltage applied to the liquid crystal cell is the difference between the voltage of the common counter electrode and the voltage of the pixel electrode. When the thin film transistor is turned off, the pixel electrode has a floating status. If any fluctuations occur in the voltages of electric elements around the pixel electrode, the fluctuations will cause the voltage of the pixel electrode to deviate from its desirable voltage. The deviation of the voltage of the pixel electrode referred to feed-through voltage ($V_{FD}$), which is represented by:

$$V_{FD}=[C_{GS}/(C_{LC}+C_{GS})]*\Delta V_G \quad (1)$$

where $C_{LC}$ is the capacitance of the liquid crystal cell (LC), $C_{SC}$ is the capacitance of the storage capacitor (SC), $C_{GS}$ is the capacitance between the source electrode and the gate electrode of the thin film transistor, and $\Delta V_G$ is the amplitude of a pulse voltage applied to the gate electrode.

In general, adjusting the voltage of the common counter electrode can compensate for the feed-through voltage. However, because the resistance and the capacitance of the scanning line round the falling edge of a pulse voltage applied to the gate electrode, a feed-through voltage of a pixel decreases as the distance between the scanning line driving circuit and the pixel increases. For example, as shown in FIG. 1, feed-through voltage of the pixel A is larger than that of the pixel B, whose feed-through voltage is larger than that of the pixel C (that is, $(V_{FD})_A>(V_{FD})_B>(V_{FD})_C$ where $(V_{FD})_A$, $(V_{FD})_B$, and $(V_{FD})_C$ represent feed-through voltages of the pixels A, B, C, respectively). Accordingly, it is difficult to compensate feed-through voltages for all pixels by adjusting the voltage of the common counter electrode. Therefore, it is hard to provide a TFT-LCD without flicker.

Furthermore, the resistances of the bus lines are so large that as a pulse voltage is input into the driver IC chips from the bus lines 17, the input voltages of the driver IC chips are different from one another, which leads to different waveforms of output voltages output from the driver IC chips. For example, as shown in FIG. 3, the waveforms of the output voltages output from the chips 16a, 16b, and 16c are quite different. The voltage difference ($\Delta V_{GA}$) output from the chip 16a is larger than the voltage difference ($\Delta V_{GB'}$) output from the chip 16b, which is larger than the voltage difference ($\Delta V_{GC'}$) output from the chip 16c. Therefore, a feed-through voltage of a pixel will decrease as the distance between the data line driving circuit and the pixel increases. That is, as shown in FIG. 1, feed-through voltage of the pixel A is larger than that of the pixel B', whose feed-through voltage is larger than that of the pixel C' (that is, $(V_{FD})_A>(V_{FD})_{B'}>(V_{FD})_{C'}$), which make flicker that reduces display quality of an LCD panel.

SUMMARY OF THE INVENTION

It is therefore an objective of the invention to provide a liquid crystal display panel with reduced flicker for solving the above-mentioned problems.

According to the invention, a liquid crystal display panel comprises an upper substrate, a lower substrate, and a plurality of pixels located between the upper substrate and the lower substrate. Each of the pixels has at least a compensating capacitor for providing an approximately identical feed-through voltage for each of the pixels, thus reducing a flicker effect of the liquid crystal display device.

It is an advantage that the invention introduces a compensating capacitor, formed by lapping a pixel electrode over a corresponding scanning line, into a pixel. By adjusting the capacitances of the compensating capacitors of the pixels, the feed-through voltages of the pixels are approximately equal, thus reducing a flicker effect of an LCD panel and further improving display quality of an LCD panel.

These and other objectives of the present invention will no doubt become obvious to those of ordinary skill in the art after reading the following detailed description of the preferred embodiment, which is illustrated in the multiple figures and drawings.

DETAILED DESCRIPTION

Figure 1:
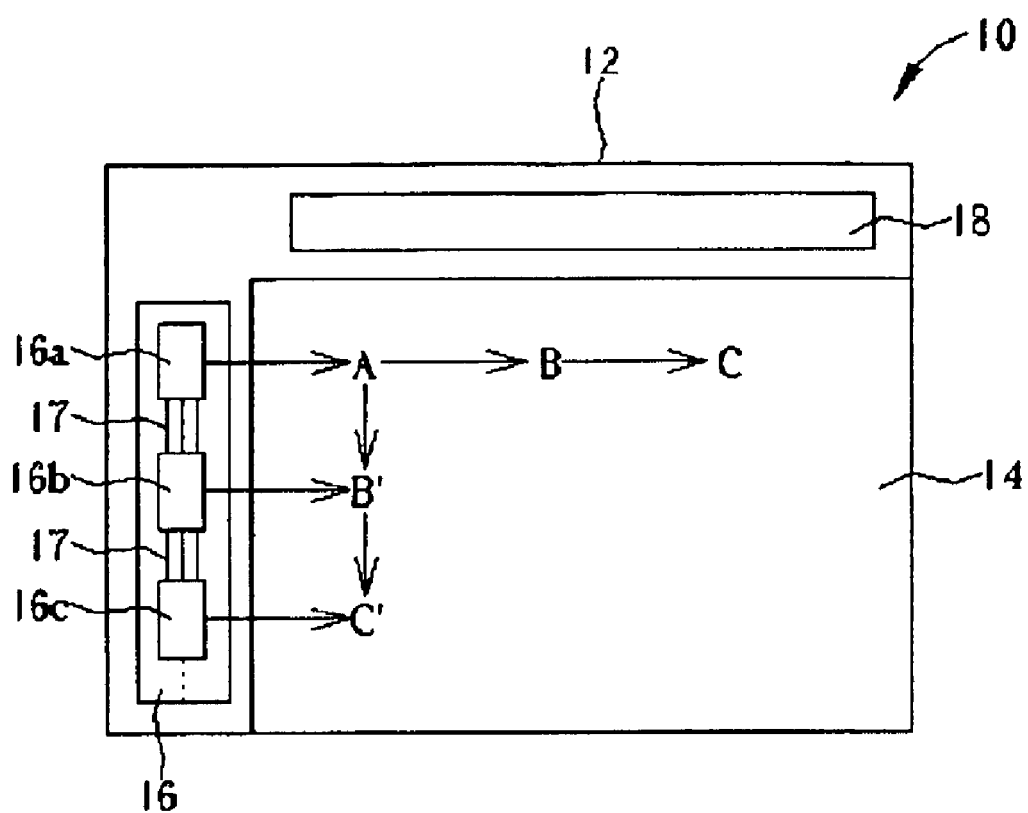
FIG. 1 is a schematic diagram of a prior art TFT-LCD.
Figure 2:
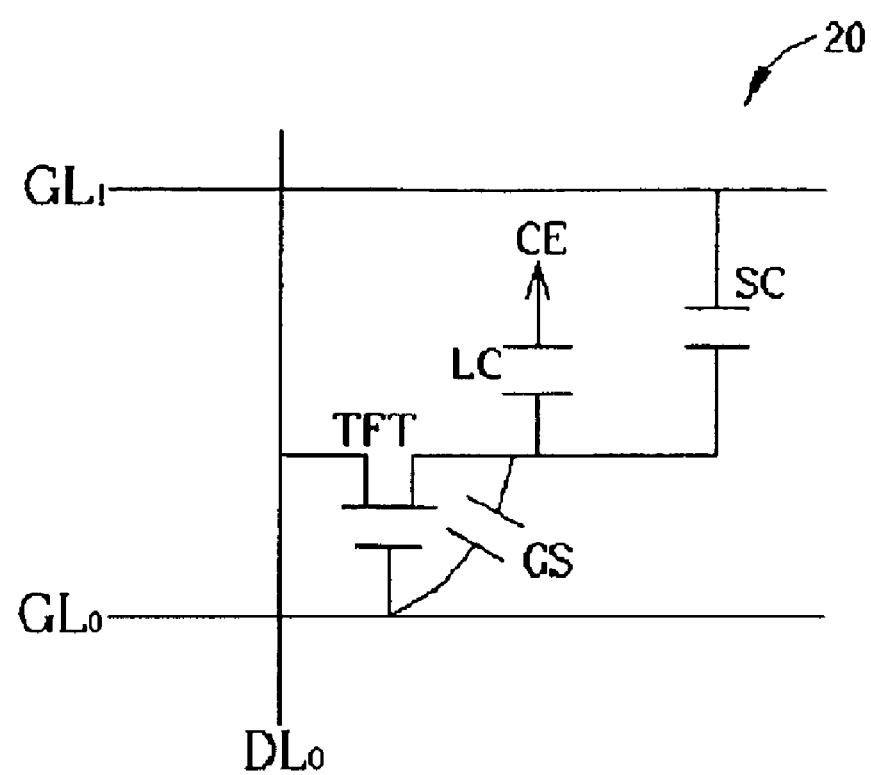
FIG. 2 is an equivalent circuit diagram of the TFT-LCD shown in FIG. 1.
Figure 3:
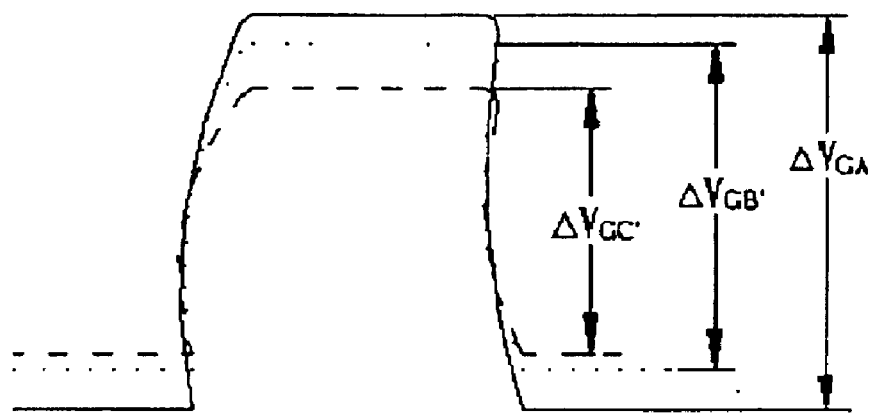
FIG. 3 illustrates waveforms of output voltages output from driver IC chips.
Figure 4:
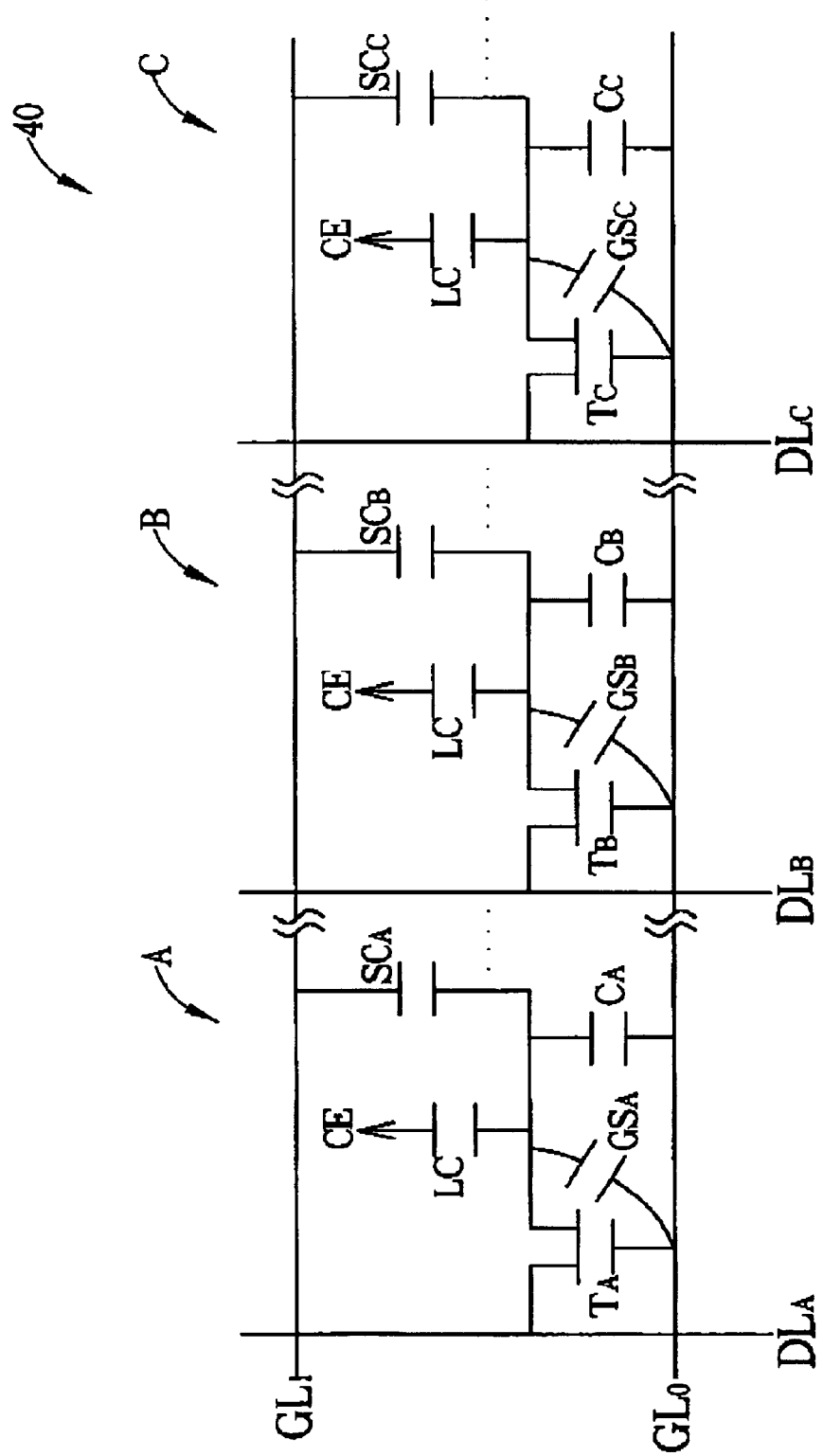
FIG. 4 is an equivalent circuit diagram according to the present invention.

Please refer to FIG. 4. FIG. 4 is an equivalent circuit diagram according to the present invention. As shown in FIG. 4, the equivalent circuit 40 comprises at least pixels A, B, and C, which respectively correspond to pixels A, B, and C shown in FIG. 1. Pixel A comprises a liquid crystal cell LC and a thin film transistor $T_A$. The liquid crystal cell LC is composed of a pixel electrode, a common counter electrode, and a liquid crystal layer there between, and therefore, the liquid crystal cell LC can be regarded as a liquid crystal capacitor. The thin film transistor $T_A$ includes a gate electrode connected to a scanning line $GL_0$, a drain electrode connected to a data line $DL_0$, and a source electrode connected to the pixel electrode of the liquid crystal cell LC. In addition, a parasitic capacitor $GS_A$ is thus produced when the gate electrode overlaps the source electrode of the thin film transistor $T_A$. Furthermore, pixel A further comprises a compensating capacitor $C_A$ connected between the pixel electrode of the liquid crystal cell LC and the scanning line $GL_0$, that is, compensating capacitor $C_A$ is connected to the scanning line $GL_0$ and either the source electrode of TFT or the pixel electrode, and a storage capacitor $SC_A$ connected between the pixel electrode of the liquid crystal cell LC and the scanning line $GL_1$.

Similarly, the pixel B comprises at least a liquid crystal cell LC, a thin film transistor $T_B$, a storage capacitor $SC_B$, a compensating capacitor $C_B$, and additionally, a parasitic capacitor $GS_B$ is generated due to an overlapping region of a gate electrode and a source electrode of the thin film transistor $T_B$. The pixel C comprises at least a liquid crystal cell LC, a thin film transistor $T_C$, a storage capacitor $SC_C$, and a compensating capacitor $C_C$. In addition, a parasitic capacitor $GS_C$ is formed when a gate electrode overlaps a source electrode of the thin film transistor $T_C$.

As shown in FIG. 4, the compensating capacitors $C_A$, $C_B$, and $C_C$ are respectively connected to the parasitic capacitors $GS_A$, $GS_B$, and $GS_C$ in parallel. Therefore, equation (1) can be rewritten as follows:

$$V_{FD}=[(C_{GS}+C)/(C_{LC}+C_{SC}+C_{GS}+C)]*\Delta V_G \qquad (2)$$

In equation (2), C represents the capacitance of the compensating capacitor C". Referring to equations (1) and (2), in general, both $C_{SC}$ and $C_{LC}$ are much larger than $C_{GS}$ and C (i.e. $C_{SC}$, $C_{LC}$>>$C_{GS}$, C). Therefore, equation (2) can be rewritten as follows:

$$V_{FD}=[(C_{GS}+C)/(C_{LC}+C_{SC})]*V_G \qquad (3)$$

Referring to FIG. 4 and equation (3). Due to the resistance and the capacitance of the scanning line $GL_0$, if $(C_{GS})_A=(C_{GS})_B=(C_{GS})_C$, $(C_{SC})_A=(C_{SC})_B=(C_{SC})_C$, $(C_{LC})_A=(C_{LC})_B=(C_{LC})_C$, and $C_A=C_B=C_C$, the feed-through voltages of pixels A, B, C is $(V_{FD})_A>(V_{FD})_B>(V_{FD})_C$, which leads to a flicker effect of the LCD panel. As described above, the feed-through voltages of pixels A, B, C has to be $(V_{FD})_A\approx(V_{FD})_B\approx(V_{FD})_C$ in order to reduce the flicker effect of the LCD panel. According to equation (3), adjusting the capacitance of the compensating capacitor C", the parasitic capacitor GS, or the storage capacitor SC can be tried to achieve approximately equal feed-through voltages of pixels A, B, C. The methods for adjusting the capacitance of the compensating capacitor C", the parasitic capacitor GS, or the storage capacitor SC are described as follows:

(1) If $C_A<C_B<C_C$, $(C_{GS})_A=(C_{GS})_B=(C_{GS})_C$, $(C_{SC})_A=(C_{SC})_B=(C_{SC})_C$, and $(C_{LC})_A=(C_{LC})_B=(C_{LC})_C$, then the feed-through voltages of pixels A, B, C is $(V_{FD})_A\approx(V_{FD})_B\approx(V_{FD})_C$. That is, the feed-through voltages of pixels A, B, C, are approximately equal as long as the condition $C_A<C_B<C_C$ is achieved. Accordingly, each of the pixels will have an approximately identical feed-through voltage, while the capacitance of the compensating capacitor C" increases as the distance between the input end of the scanning line and the pixel increases.

(2) If $(C_{GS})_A<C_{GS})_B<(C_{GS})_C$, $C_A=C_B=C_C$, $(C_{SC})_A=(C_{SC})_B=(C_{SC})_C$, and $(C_{LC})_A=(C_{LC})_B=(C_{LC})_C$, then the feed-through voltages of pixels A, B, C is $(V_{FD})_A\approx(V_{FD})_B\approx(V_{FD})_C$. That is, the feed-through voltages of pixels A, B, C, are approximately equal as long as the condition $(C_{GS})_A<(C_{GS})_B<(C_{GS})_C$ is achieved. As a result, while the capacitance of the parasitic capacitor GC increases as the distance between the input end of the scanning line and the pixel increases, each of the pixels will have approximately the same feed-through voltage.

(3) If $(C_{SC})_A>(C_{SC})_B>(C_{SC})_C$, $C_A=C_B=C_C$, $(C_{GS})_A=(C_{GS})_B=(C_{GS})_C$, and $(C_{LC})_A=(C_{LC})_B=(C_{LC})_C$, then the feed-through voltages of pixels A, B, C is $(V_{FD})_A\approx(V_{FD})_B\approx(V_{FD})_C$. That is, the feed-through voltages of pixels A, B, C, are approximately equal as long as the condition $(C_{SC})_A>(C_{SC})_B>(C_{SC})_C$ is achieved. As a result, while the capacitance of the storage capacitor SC decreases as the distance between the input end of the scanning line and the pixel increases, each of the pixels will have approximately the same feed-through voltage.

Moreover, the above-mentioned methods (1), (2), and (3) can be combined with one another to achieve approximately equal feed-through voltages of pixels A, B, C. The following description describes various embodiments of the present invention according to the above-mentioned methods (1), (2), and (3).

Figure 5A:
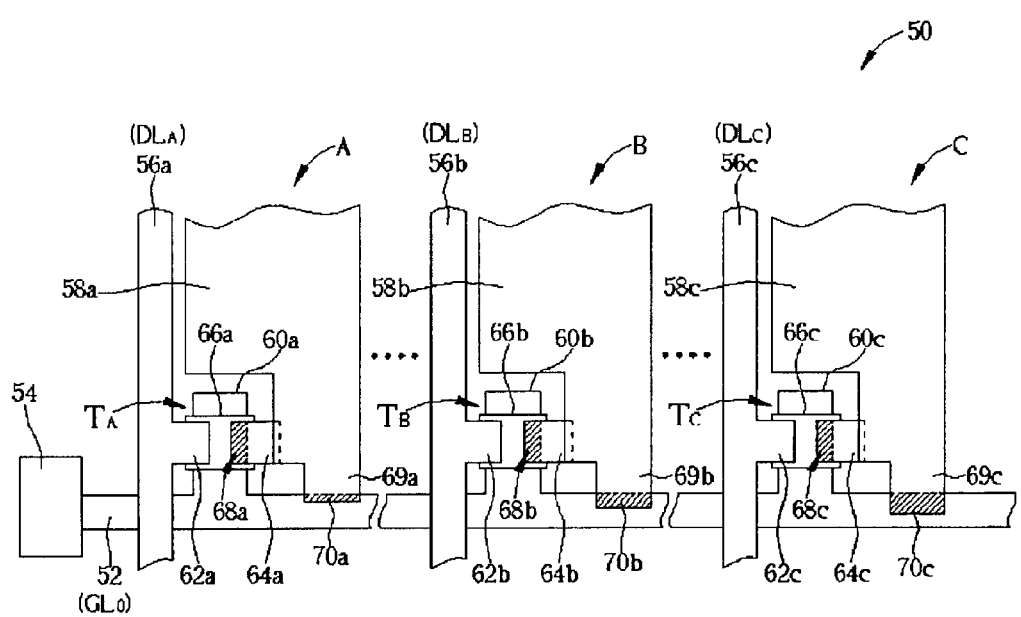
FIG. 5(A) and FIG. 5(B) are top views of a pixel array of an LCD panel according to the first embodiment of the present invention.
Figure 5B:
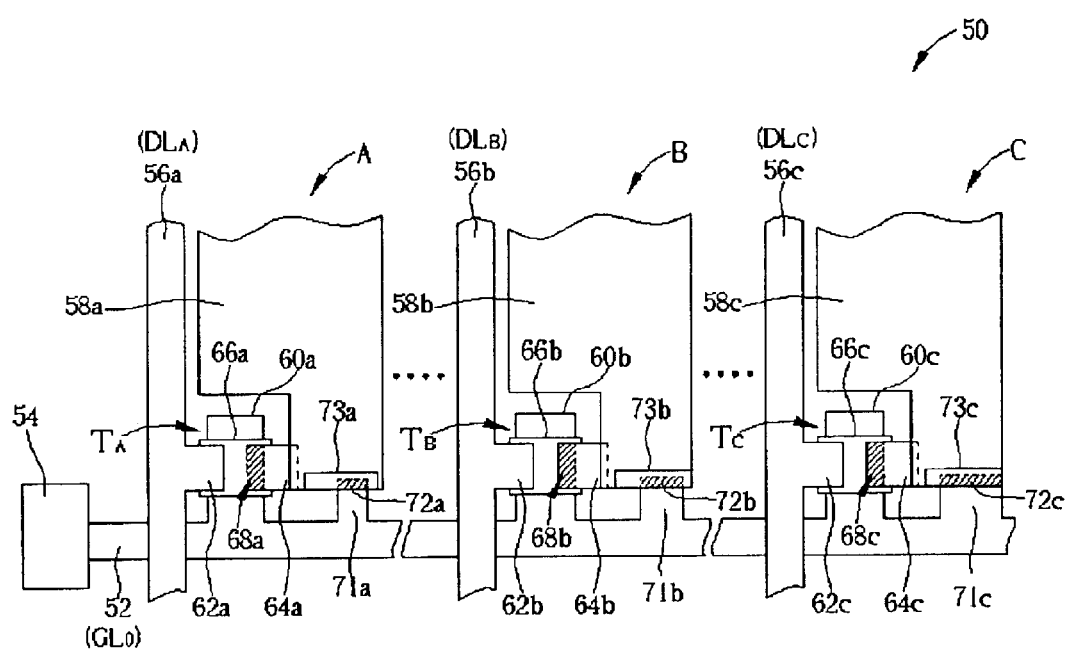

Please refer to FIG. 5(A) and FIG. 5(B). FIG. 5(A) and FIG. 5(B) are top views of a pixel array of an LCD panel according to the first embodiment of the present invention. Moreover, the first embodiment of the present invention is implemented according to the above-mentioned method (1). As shown in FIG. 5(A), a pixel array 50 comprises at least a scanning line 52 electrically connected to a scanning line driving circuit 54, and data lines 56a, 56b, 56c, which are electrically connected to a data line driving circuit (not shown). Additionally, the pixel array 50 further comprises pixels A, B, and C, which respectively include thin film transistors $T_A$, $T_B$, $T_C$ and corresponding liquid crystal cells (not shown). The gate electrodes 60a, 60b, 60c of thin film transistors $T_A$, $T_B$, $T_C$ are connected to the scanning line 52. The drain electrodes 62a, 62b, 62c of the thin film transistors $T_A$, $T_B$, $T_C$ are respectively connected to the data lines 56a, 56b, 56c. The source electrodes 64a, 64b, 64c of thin film transistors $T_A$, $T_B$, $T_C$ are connected to pixel electrodes 58a, 58b, 58c of the liquid crystal cells separately. Furthermore, semi-conductive layers 66a, 66b, 66c are respectively disposed between the gate electrodes and the source, the drain electrodes.

As shown in FIG. 5(A), the pixels A, B, C further comprise overlapping regions 68a, 68b, and 68c. The overlapping region 68a is formed by lapping the source electrode 64a over the gate electrode 60a, a portion of the scanning line 52. Equally, the overlapping regions 68b, 68c are respectively formed by lapping the source electrodes 64b, 64c over the gate electrodes 60b, 60c, a portion of the scanning line 52. In addition, the pixels A, B, C further comprise overlapping regions 70a, 70b, and 70c. The pixel electrodes 58a, 58b, 58c include extension portions 69a, 69b, 69c respectively. The overlapping region 70a is formed by lapping the extension portion 69a over the scanning line 52. Similarly, the overlapping regions 70b, 70c are respectively formed by lapping the extension portions 69b, 69c over the scanning line 52. The area of the overlapping region 70a is smaller than that of the overlapping region 70b, whose area is smaller than that of the overlapping region 70c.

In the first embodiment, the overlapping regions 68a, 68b, and 68c respectively correspond to the parasitic capacitors $GS_A$, $GS_B$, and $GS_C$ shown in FIG. 4, while the overlapping regions 70a, 70b, and 70c respectively correspond to the compensating capacitors $C_A$, $C_B$, and $C_C$ shown in FIG. 4. Since the areas of the overlapping regions 70a, 70b, and 70c are increased sequentially, the capacitance of the compensating capacitor $C_A$ is smaller than the capacitance of the compensating capacitor $C_B$, whose capacitance is smaller than that of the compensating capacitor $C_C$ (i.e. $C_A<C_B<C_C$). Thus, feed-through voltages of pixels A, B, C, are approximately equal (i.e. $(V_{FD})_A \approx (V_{FD})_B \approx (V_{FD})_C$). Additionally, the shapes of the overlapping regions 70a, 70b, and 70c are not necessarily rectangular. They can be any shape as long as the area of the overlapping region 70a is smaller than that of the overlapping region 70b, whose area is smaller than that of the overlapping region 70c. Moreover, owing to large space existing between the pixel electrodes and the scanning line, the first embodiment of the present invention can be applied to a large-scaled liquid crystal display panel.

In addition, the first embodiment of the present invention can be carried out in an alternative way, which is shown in FIG. 5(B). As shown in the pixel array 50 of FIG. 5(B), the scanning line 52 comprises extension portions 71a, 71b, and 71c, which are respectively positioned below the pixel electrodes 58a, 58b, and 58c. Therefore, overlapping regions 72a, 72b, and 72c are formed, and furthermore, the area of the overlapping region 72a is smaller than that of the overlapping region 72b, whose area is smaller than that of the overlapping region 72c.

Referring to FIG. 5(B) and FIG. 4, the overlapping regions 68a, 68b, and 68c respectively correspond to the parasitic capacitors $GS_A$, $GS_B$, and $GS_C$, while the overlapping regions 72a, 72b, and 72c respectively correspond to the compensating capacitors $C_A$, $C_B$, and $C_C$. Since the areas of the overlapping regions 72a, 72b, and 72c are increased sequentially, the capacitance of the compensating capacitor $C_A$ is smaller than the capacitance of the compensating capacitor $C_B$, whose capacitance is smaller than that of the compensating capacitor $C_C$ (i.e. $C_A<C_B<C_C$). Thus, feed-through voltages of pixels A, B, C, are approximately equal.

As shown in FIG. 5(B), for regulating an alignment direction of liquid crystal molecules, protrusion structures 73a, 73b, and 73c are formed on the pixel electrodes 58a, 58b, and 58c, and are positioned over the extension portions 71a, 71b, and 71c. The protrusion structures 73a, 73b, and 73c can prevent the extension portions 71a, 71b, and 71c of the scanning line 52 from disturbing the alignment direction of liquid crystal molecules. In general, the protrusion structures 73a, 73b, and 73c are made of photoresist materials, for example. Moreover, the protrusion structures 73a, 73b, and 73c can be formed over a common electrode on an upper substrate (not shown), which is positioned parallel to a lower substrate (not shown) where the pixel array 50 is positioned.

Figure 6:
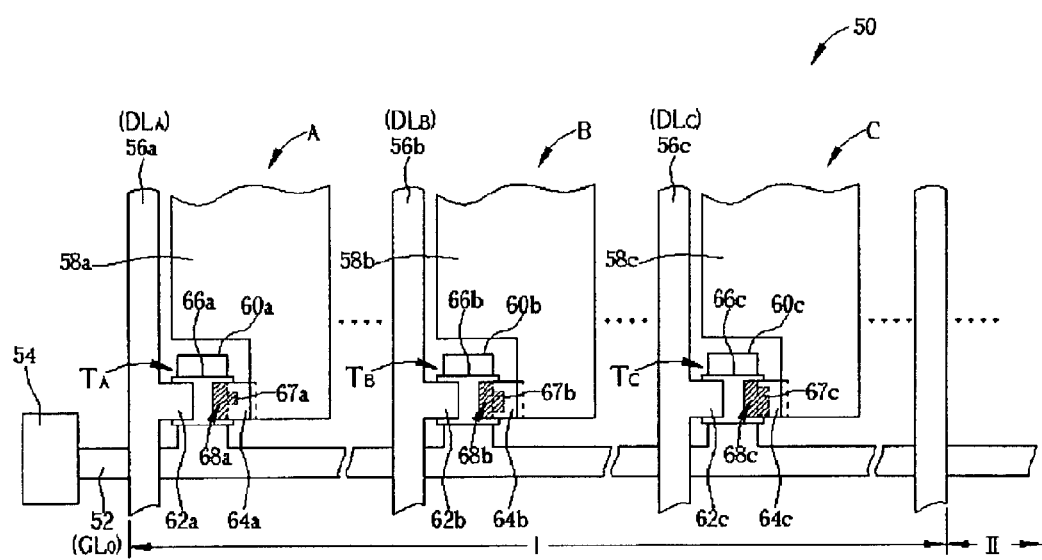
FIG. 6 is a top view of a pixel array of an LCD panel according to the second embodiment of the present invention.

Please refer to FIG. 6. FIG. 6 is a top view of a pixel array of an LCD panel according to the second embodiment of the present invention. Furthermore, the second embodiment of the present invention is implemented according the above-mentioned methods (1) and (2). As shown in FIG. 6, the pixel array 50 is at least divided into a I and a part II. The pixels A, B, and C are located within the part I. The gate electrodes 60a, 60b, 60c of the thin film transistors $T_A$, $T_B$, $T_C$ further comprise blocks 67a, 67b, 67c, which are located within the overlapping regions 68a, 68b, 68c. The area of the block 67a is smaller than that of the block 67b, whose area is smaller than that of the block 67c. Thus, the area of the overlapping region 68a is smaller than that of the overlapping region 68b, whose area is smaller than that of the overlapping region 68c.

Referring to FIG. 6 and FIG. 4, the overlapping regions 68a, 68b, and 68c respectively correspond to the parasitic capacitors $GS_A$, $GS_B$, and $GS_C$. Since the areas of the overlapping regions 68a, 68b, and 68c are increased sequentially, the capacitance of the parasitic capacitor $GS_A$ is smaller than the capacitance of the parasitic capacitor $GS_B$, whose capacitance is smaller than that of the parasitic capacitor $GS_C$ (i.e. $(C_{GS})_A<(C_{GS})_B<(C_{GS})_C$). Thus, feed-through voltages of pixels A, B, C, are approximately equal (i.e. $(V_{FD})_A \approx (V_{FD})_B \approx (V_{FD})_C$). In brief, the second embodiment utilizes adjusting the capacitances of the parasitic capacitors GS of the pixels to achieve approximately equal feed-through voltages of the pixels within the part I of the pixel array 50.

In addition, adjusting only the capacitances of the parasitic capacitors GS of the pixels is not suitable for a large-scaled LCD panel, because of restrictions on the sizes of both the gate electrodes and the source electrodes. As a result, in the second embodiment of the present invention, the pixel array 50 further comprises a part II, and moreover, the pixels within the part II utilize adjusting the capacitances of the compensating capacitors C" of the pixels to achieve approximately equal feed-through voltages. The structures of the pixels within the part II can be designed by referring to the first embodiment of the present invention, and will not be described again.

Figure 7:
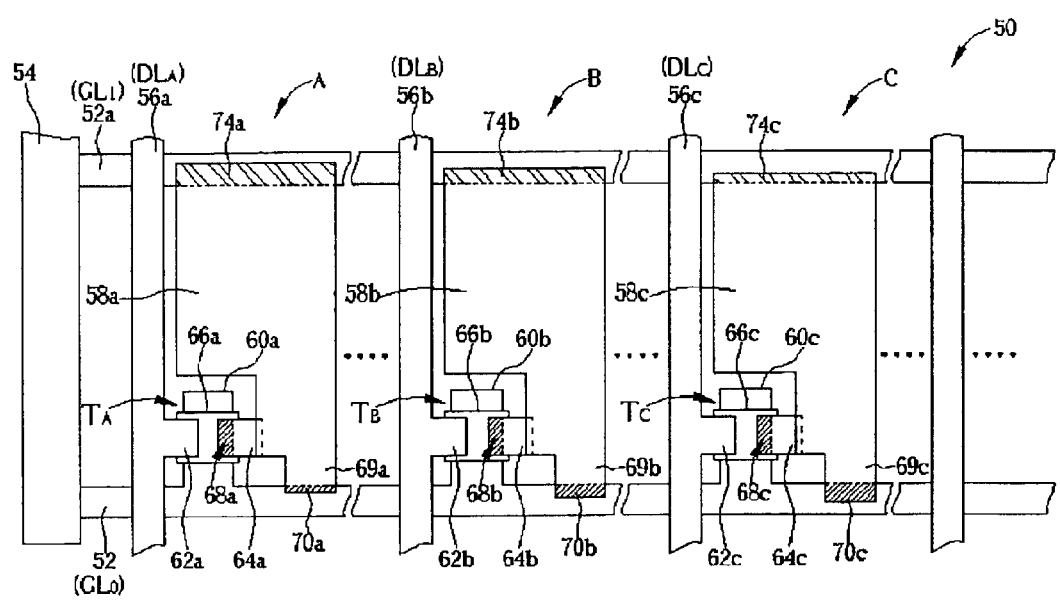
FIG. 7 is a top view of a pixel array of an LCD panel according to the third embodiment of the present invention.

Please refer to FIG. 7. FIG. 7 is a top view of a pixel array of an LCD panel according to the third embodiment of the present invention. Furthermore, the third embodiment of the present invention is implemented according the above-mentioned methods (1) and (3). As shown in FIG. 7, the pixels A, B, C comprise overlapping regions 70a, 70b, and 70c. The pixel electrodes 58a, 58b, 58c include extension portions 69a, 69b, 69c respectively. The overlapping region 70a, 70b, 70c are respectively formed by lapping the extension portions 69a, 69b, 69c over the scanning line 52. The area of the overlapping region 70a is smaller than that of the overlapping region 70b, whose area is smaller than that of the overlapping region 70c. In addition, the pixels A, B, and C further comprise overlapping regions 74a, 74b, and 74c respectively. The overlapping regions 74a, 74b, 74c are separately formed by lapping the pixel electrodes 58a, 58b, 58c over the scan line 52a. Moreover, the area of the overlapping region 74a is larger than that of the overlapping region 74b, whose area is larger than that of the overlapping region 74c.

Referring to FIG. 7 and FIG. 4, the overlapping regions 74a, 74b, and 74c respectively correspond to the storage capacitors $SC_A$, $SC_B$, and $SC_C$, while the overlapping regions 70a, 70b, and 70c respectively correspond to the compensating capacitors $C_A$, $C_B$, and $C_C$. Since the areas of the overlapping regions 70a, 70b, and 70c are increased gradually, the capacitances of the compensating capacitor $C_A$, $C_B$, and $C_C$ are increased sequentially (i.e. $C_A<C_B<C_C$). Moreover, the areas of the overlapping regions 74a, 74b, and 74c are decreased gradually, so that the capacitances of the storage capacitors $SC_A$, $SC_B$, and $SC_C$ are therefore decreased sequentially (i.e. $(C_{SC})_A>(C_{SC})_B>(C_{SC})_C$). Thus, feed-through voltages of pixels A, B, C, can be approximately equal (i.e. $(V_{FD})_A\approx(V_{FD})_B\approx(V_{FD})_C$).

In addition, the capacitance of a storage capacitor SC cannot be reduced without limitation, because as the storage capacitor SC gets farther from the scanning line driving circuit 54, its capacitance becomes smaller. As a result, it is hard for such a storage capacitor with low capacitance to help the liquid crystal cells hold electric charges. Therefore, as the capacitance of the storage capacitor SC cannot be further reduced, the third embodiment of the present invention will only adjust the capacitances of the compensating capacitors C" of the pixels to achieve approximately equal feed-through voltages. Accordingly, the third embodiment of the present invention can not only provide an identical feed-through voltage for each of the pixels, but also prevent a storage capacitor from losing its ability to hold electric charges of the liquid crystal cells.

Figure 8:
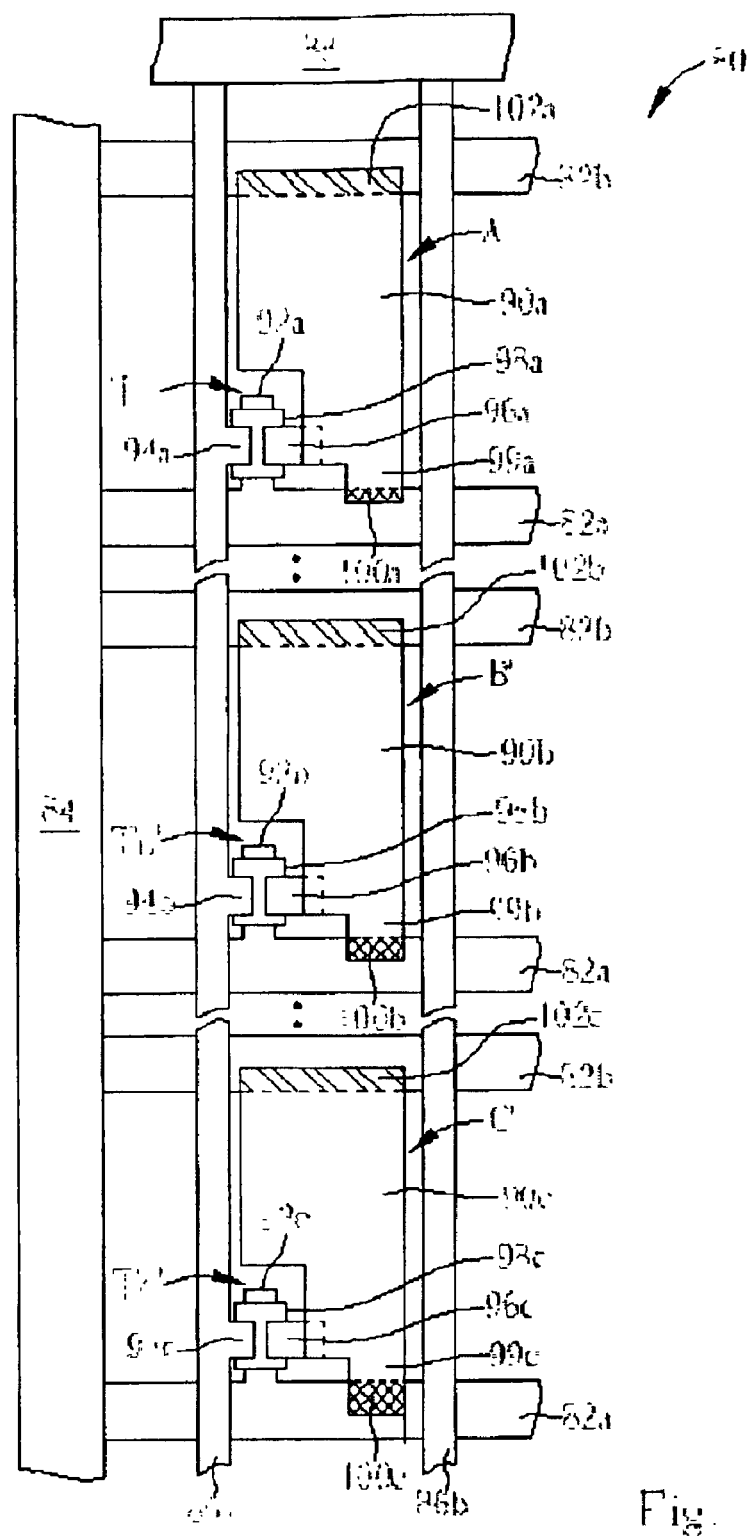
FIG. 8 is a top view of a pixel array of an LCD panel according to the fourth embodiment of the present invention.

Please refer to FIG. 8. FIG. 8 is a top view of a pixel array of an LCD panel according to the fourth embodiment of the present invention. Moreover, the fourth embodiment of the present invention is implemented according the above-mentioned method (1). As shown in FIG. 8, a pixel array 80 comprises at least a plurality of scanning lines 82a and 82b electrically connected to a scanning line driving circuit 84, and data lines 86a, 86b electrically connected to a data line driving circuit 88. Additionally, the pixel array 80 further comprises pixels A, B', and C', which correspond to the pixels A, B', and C' of FIG. 1. The pixels A, B', and C' comprise thin film transistors $T_A$, $T_{B'}$, $T_{C'}$ and corresponding liquid crystal cells (not shown). The gate electrodes 92a, 92b, 92c of thin film transistors $T_A$, $T_{B'}$, $T_{C'}$ are connected to the scanning lines 82a. The drain electrodes 94a, 94b, 94c of the thin film transistors $T_A$, $T_{B'}$, $T_{C'}$ are respectively connected to the data line 86a. The source electrodes 96a, 96b, 96c of thin film transistors $T_A$, $T_{B'}$, $T_{C'}$ are connected to pixel electrodes 90a, 90b, 90c of the liquid crystal cells respectively. Furthermore, semi-conductive layers 98a, 98b, 98c are separately disposed between the gate electrodes and the source, the drain electrodes.

In addition, as shown in FIG. 8, the pixel electrodes 90a, 90b, and 90c include extension portions 99a, 99b, and 99c. Thus, overlapping region 100a, 100b, and 100c are formed in the pixels A, B', and C'. The overlapping region 100a is formed by lapping the extension portion 99a over the scanning line 82a. Similarly, the overlapping regions 100b, 100c are respectively formed by lapping the extension portions 99b, 99c over the scanning lines 82a. The area of the overlapping region 100a is smaller than that of the overlapping region 100b, whose area is smaller than that of the overlapping region 100c. Additionally, the pixel electrodes 90a, 90b, and 90c are lapped over the scanning lines 82b to form overlapping regions 102a, 102b, and 102c, which form the storage capacitors of the pixels A, B', and C'.

In the fourth embodiment, the overlapping regions 100a, 100b, and 100c respectively correspond to the compensating capacitors $C_A$, $C_{B'}$, and $C_{C'}$ (not shown). Since the areas of the overlapping regions 100a, 100b, and 100c are increased sequentially, the capacitance of the compensating capacitor $C_A$ is smaller than the capacitance of the compensating capacitor $C_{B'}$, whose capacitance is smaller than that of the compensating capacitor $C_{C'}$ (i.e. $C_A<C_{B'}<C_{C'}$). Thus, feed-through voltages of pixels A, B', C', are approximately equal (that is, $(V_{FD})_A\approx(V_{FD})_{B'}\approx(V_{FD})_{C'}$).

Alternatively, the overlapping regions 100a, 100b, and 100c can be formed by extending the scanning lines 82a under the pixel electrodes 90a, 90b, and 90c, which can reach the same purpose as the fourth embodiment of the present invention.

The present invention introduces a compensating capacitor, formed by lapping a pixel electrode over a corresponding scanning line, into a pixel. By adjusting the capacitances of the compensating capacitors of the pixels, the feed-through voltages of the pixels are approximately equal, thus reducing a flicker effect of an LCD panel and further improving display quality of an LCD panel.

Those skilled in the art will readily observe that numerous modifications and alterations of the device may be made while retaining the teachings of the invention. Accordingly, the above disclosure should be construed as limited only by the metes and bound of the appended claims.

What is claimed is:

1. A liquid crystal display panel comprising:
    an upper substrate;
    a lower substrate;
    a plurality of pixels located between the upper substrate and the lower substrate;
    a first scanning line;
    a second scanning line; and
    a scanning line driving circuit, each of the pixels being located between the first scanning line and the second scanning line and having at least a compensating capacitor for providing an approximately identical feed-through voltage for each of the pixels, each of the first scanning line and the second scanning line having a first input end so that the scanning line driving circuit can input signals into the first scanning line and the second scanning line through the first input ends;
    wherein the larger a distance between the first input end of the second scanning line and a corresponing one of the plurality of pixels is, the larger a capacitance of the compensating capacitor of the corresponding pixel is.

2. The liquid crystal display panel of claim 1 wherein each of the pixels further comprises:
    a liquid crystal cell having a common electrode, a pixel electrode connected to the corresponding compensating capacitor, and a liquid crystal layer disposed between the pixel electrode and the common electrode; and a thin film transistor having a gate electrode connected to the first scanning line, a drain electrode connected to a corresponding first data line, and a source electrode connected to the pixel electrode.

3. The liquid crystal display panel of claim 2 wherein each of the compensating capacitors is composed of a first overlapping region, which is formed by overlapping the corresponding pixel electrode over the first scanning line.

4. The liquid crystal display panel of claim 3 wherein the larger a distance between the first input end of the first scanning line and the corresponding pixel is, the larger an area of the first overlapping region of the corresponding pixel is.

5. The liquid crystal display panel of claim 2 wherein each of the compensating capacitors is composed of a second overlapping region, which is formed by overlapping the corresponding source electrode over the corresponding gate electrode.

6. The liquid crystal display panel of claim 5 wherein the larger a distance between the first input end of the first scanning line and the corresponding pixel is, the larger an area of the second overlapping region of the corresponding pixel is.

7. The liquid crystal display panel of claim 5 wherein each of the pixels further comprises a storage capacitor, and the larger a distance between the first input end of the second scanning line and the corresponding pixel is, the smaller a capacitance of the storage capacitor of the corresponding pixel is.

8. The liquid crystal display panel of claim 1 further comprising a second data line and a data line driving circuit, each of the pixels being connected to the second data line, which has a second input end so that the data line driving circuit can input signals into the second data line through the second input end.

9. The liquid crystal display panel of claim 8 wherein the larger a distance between the second input end and the corresponding pixel is, the larger a capacitance of the compensating capacitor of the corresponding pixel is.

10. The liquid crystal display panel of claim 9 wherein each of the pixels is located between a third scanning line and a fourth scanning line, and further comprises:

a liquid crystal cell having a common electrode, a pixel electrode connected to the corresponding compensating capacitor, and a liquid crystal layer disposed between the pixel electrode and the common electrode; and a thin film transistor having a gate electrode connected to the corresponding third scanning line, a drain electrode connected to the second data line, and a source electrode connected to the pixel electrode.

11. The liquid crystal display panel of claim 10 wherein each of the compensating capacitors is composed of a first overlapping region, which is formed by overlapping the corresponding pixel electrode over the corresponding third scanning line.

12. The liquid crystal display panel of claim 11 wherein the larger a distance between the second input end and the corresponding pixel is, the larger an area of the first overlapping region of the corresponding pixel is.

13. The liquid crystal display panel of claim 10 wherein each of the compensating capacitors is composed of a second overlapping region, which is formed by overlapping the corresponding source electrode over the corresponding gate electrode.

14. The liquid crystal display panel of claim 13 wherein the larger a distance between the second input end and the corresponding pixels is, the larger an area of the second overlapping region of the corresponding pixel is.

15. The liquid crystal display panel of claim 10 wherein each of the pixels further comprises a storage capacitor, and the larger a distance between the second input end and the corresponding pixel is, the smaller a capacitance of the storage capacitor of the corresponding pixel is.

16. A liquid crystal display panel comprising:

a plurality of scanning lines, each of the scanning lines having at least one signal input end;

a plurality of data lines, each of the data lines having at least one signal input end; and a plurality of pixels, each of the pixels having a pixel electrode, and a thin film transistor having a gate electrode connected to the corresponding scanning line, a drain electrode connected to the corresponding data line, and a source electrode connected to the pixel electrode, wherein a first overlapping region is formed by overlapping the pixel electrode over the corresponding scanning line;

wherein the larger a distance between one of the signal input ends and a corresponding one of the pixels is, the greater an area of the corresponding first overlapping region is.

17. The liquid crystal display panel of claim 16 wherein each of the first overlapping region forms a compensating capacitor for providing an approximately identical feed-through voltage for each of the pixels, thus reducing a flicker effect of the liquid crystal display panel.

18. The liquid crystal display panel of claim 16 wherein each of the pixel electrodes comprises a first extending portion partially overlapping the corresponding scanning line so as to form each of the first overlapping regions.

19. The liquid crystal display panel of claim 16 wherein each of the pixel electrodes partially overlaps a second extending portion of the corresponding scanning line so as to form each of the first overlapping regions.

20. The liquid crystal display panel of claim 19 wherein a protrusion structure is disposed on each of the pixel electrodes and above the corresponding second extending portion, for regulating an alignment direction of liquid crystal molecules.

21. The liquid crystal display panel of claim 16 further comprising a scanning line driving circuit and a data line driving circuit, wherein the scanning line driving circuit inputs signals into each of the scanning lines through a first input end of each of the scanning lines, and the data line driving circuit inputs signals into each of the data lines through a second input end of each of the data lines.

22. The liquid crystal display panel of claim 21 wherein the signal input end is the first input end of one of the scanning lines.

23. The liquid crystal display panel of claim 21 wherein the signal input end is the second input end of one of the data lines.

24. The liquid crystal display panel of claim 21 wherein a second overlapping region is formed by overlapping each of the source electrodes over the corresponding gate electrode of each of the source electrodes.

25. The liquid crystal display panel of claim 24 wherein each of the second overlapping regions forms a compensating capacitor for providing an approximately identical feed-through voltage for each of the pixels, thus reducing a flicker effect of the liquid crystal display panel.

26. The liquid crystal display panel of claim 25 wherein the larger a distance between the corresponding first input end and the corresponding pixel is, the greater an area of the corresponding second overlapping region is.

27. The liquid crystal display panel of claim 25 wherein the larger a distance between the corresponding second input end and the corresponding pixel is, the greater an area of the corresponding second overlapping region is.

28. A liquid crystal display panel comprising:
   a scanning line driving circuit;
   at least a scanning line connected to the scanning line driving circuit;
   a first region positioned on the scanning line having at least a first pixel, which comprises a first pixel electrode, a first overlapping region being formed by overlapping the first pixel electrode over the scanning line; and
   a second region positioned on the scanning line having at least a second pixel, which comprises a second pixel electrode, a second overlapping region being formed by overlapping the second pixel electrode over the scanning line;
   wherein the first region is located between the scanning line driving circuit and the second region, and an area of the second overlapping region is larger than an area of the first overlapping region.

29. The liquid crystal display panel of claim 28 wherein the first pixel further comprises a first thin film transistor, which includes a first gate electrode connected to the scanning line, a first drain electrode connected to a first data line, and a first source electrode connected to the first pixel electrode, and a third overlapping region is formed by overlapping the first source electrode over the first gate electrode.

30. The liquid crystal display panel of claim 29 wherein the second pixel further comprises a second thin film transistor, which includes a second gate electrode connected to the scanning line, a second drain electrode connected to a second data line, and a second source electrode connected to the second pixel electrode, and a fourth overlapping region is formed by overlapping the second source electrode over the second gate electrode.

31. The liquid crystal display panel of claim 30 wherein an area of the fourth overlapping is region is larger than an area of the third overlapping region.

32. A liquid crystal display panel comprising:
   a data line driving circuit;
   at least a data line connected to the data line driving circuit;
   a first region positioned on the data line having at least a first thin film transistor, which comprises a first gate electrode connected to a first scanning line, a first drain electrode connected to the data line, and a first source electrode connected to a first pixel electrode, a first overlapping region being formed by overlapping the first pixel electrode over the first scanning line; and
   a second region positioned on the data line having at least a second thin film transistor, which comprises a second gate electrode connected to a second scanning line, a second drain electrode connected to the data line, and a second source electrode connected to a second pixel electrode, a second overlapping region being formed by overlapping the second pixel electrode over the second scanning line;
   wherein the first region is located between the data line driving circuit and the second region, and an area of the second overlapping region is larger than an area of the first overlapping region.

33. The liquid crystal display panel of claim 32 wherein a third overlapping region is formed by overlapping the first source electrode over the first gate electrode, a fourth overlapping region is formed by overlapping the second source electrode over the second gate electrode, and an area of the fourth overlapping region is larger than an area of the third overlapping region.

34. The liquid crystal display panel of claim 32 wherein the first region comprises a plurality of the first thin film transistors, and the larger a distance between the data line driving circuit and one of the first thin film transistors is, the greater an area of the corresponding first overlapping region is.

35. The liquid crystal display panel of claim 32 wherein the second region comprises a plurality of the second thin film transistors, and the larger a distance between the data line driving circuit and one of the second thin film transistors is, the greater an area of the corresponding second overlapping region is.

36. A liquid crystal display panel comprising:
   a plurality of scanning lines for transmitting scanning signals from a scanning line driving circuit;
   a plurality of data lines for transmitting image signals from a data line driving circuit; and
   a plurality of pixels, each of the pixels comprising:
      a liquid crystal capacitor;
      a thin film transistor electrically connected to the corresponding scanning line, the corresponding data line, and the liquid crystal capacitor; and
      a compensating capacitor electrically connected between the liquid crystal capacitor and the corresponding scanning line, being connected to the thin film transistor, for providing an approximately identical feed-through voltage for each of the pixels;
   wherein the larger a distance between the scanning line driving circuit and a corresponding one of the pixels is, the greater a capacitance of the compensating capacitor of the corresponding pixel is.

37. The liquid crystal display panel of claim 36 wherein the larger a distance between the data line driving circuit and a corresponding one of the pixels is, the greater a capacitance of the corresponding compensating capacitor is.

38. The liquid crystal display panel of claim 36 wherein each of the pixels further comprises a storage capacitor connected to the liquid crystal capacitor of the pixel.

39. The liquid crystal display panel of claim 38 wherein the larger a distance between the scanning line driving circuit and the storage capacitor is, the smaller a capacitance of the storage capacitor is.

40. The liquid crystal display panel of claim 38 wherein the larger a distance between the data line driving circuit and the storage capacitor is, the smaller a capacitance of the storage capacitor is.

* * * * *